US007851971B2

(12) United States Patent
Chang et al.

(10) Patent No.: US 7,851,971 B2
(45) Date of Patent: Dec. 14, 2010

(54) LOW FREQUENCY QUARTZ BASED MEMS RESONATORS AND METHOD OF FABRICATING THE SAME

(75) Inventors: David T. Chang, Calabasas, CA (US); Randall L. Kubena, Oak Park, CA (US); Frederic P. Stratton, Beverly Hills, CA (US); Pamela R. Patterson, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/577,420

(22) Filed: Oct. 12, 2009

(65) Prior Publication Data

US 2010/0033062 A1 Feb. 11, 2010

Related U.S. Application Data

(62) Division of application No. 12/189,617, filed on Aug. 11, 2008, now Pat. No. 7,647,688.

(51) Int. Cl.
*H01L 41/08* (2006.01)

(52) U.S. Cl. ....................... 310/320; 310/321; 310/322; 310/324

(58) Field of Classification Search ......... 310/320–322, 310/324, 344
See application file for complete search history.

(56) References Cited

U.S. PATENT DOCUMENTS

| | | | | |
|---|---|---|---|---|
| 4,364,016 | A | 12/1982 | Tanski | 333/193 |
| 4,442,574 | A | 4/1984 | Wanuga et al. | 29/25.35 |
| 5,480,747 | A | 1/1996 | Vasudev | 430/5 |
| 5,666,706 | A | 9/1997 | Tomita et al. | 29/25.35 |
| 6,362,561 | B1 * | 3/2002 | Kuroda et al. | 310/320 |
| 6,528,924 | B1 * | 3/2003 | Stelzl et al. | 310/344 |
| 7,237,315 | B2 | 7/2007 | Kubena et al. | 29/594 |

* cited by examiner

*Primary Examiner*—J. SanMartin
(74) *Attorney, Agent, or Firm*—Ladas & Parry

(57) ABSTRACT

A method for fabricating a low frequency quartz resonator includes metalizing a top-side of a quartz wafer with a metal etch stop, depositing a first metal layer over the metal etch stop, patterning the first metal layer to form a top electrode, bonding the quartz wafer to a silicon handle, thinning the quartz wafer to a desired thickness, depositing on a bottom-side of the quartz wafer a hard etch mask, etching the quartz wafer to form a quartz area for the resonator and to form a via through the quartz wafer, removing the hard etch mask without removing the metal etch stop, forming on the bottom side of the quartz wafer a bottom electrode for the low frequency quartz resonator, depositing metal for a substrate bond pad onto a host substrate wafer, bonding the quartz resonator to the substrate bond pad, and removing the silicon handle.

4 Claims, 8 Drawing Sheets

LOW FREQUENCY QUARTZ BASED MEMS RESONATORS AND METHOD OF FABRICATING THE SAME

CROSS-REFERENCE TO RELATED APPLICATIONS

This application is a division of U.S. patent application Ser. No. 12/189,617, filed on Aug. 11, 2008, the disclosure of which is incorporated herein in its entirety.

FIELD

This disclosure relates to quartz based MEMS resonators, and in particular to low frequency quartz based MEMS resonators and methods for fabricating them.

BACKGROUND

The resonant frequency for a quartz resonator is determined by the thickness of the quartz between two electrodes of the resonator. U.S. Pat. No. 7,237,315 to Kubena et al. for a Method for Fabricating a Resonator, which is incorporated herein by reference and commonly assigned with the present application, describes a method for fabricating a quartz resonator. In that prior art, plasma dry etching technology is used to form the resonator structure with soft photoresist used for masking. However, there is a substantial difference in the quartz thickness required for quartz resonators with greater than 100 MHz resonant frequencies (several microns) and the quartz thickness required for quartz resonators at lower frequencies at or below the VHF frequency band (several tens or hundreds of microns). Low frequency quartz resonators have much greater quartz thicknesses and so the fabrication methods used for high frequency quartz resonators are not always appropriate for low frequency quartz resonators.

FIGS. 1*a* to 1*l* show a prior art method of fabricating quartz resonators. Although the method fabricates many resonators at once, FIG. 1 shows only one resonator being fabricated. The starting materials are a single-crystal quartz wafer 20, a silicon handle wafer 30, and a host substrate 40 as shown in FIG. 1*a*. The process begins by defining and etching a cavity 32 in a silicon handle wafer 30, as shown in FIG. 1*b*. Then, a top-side electrode 22 and tuning pad metal (Al or Au) 25 and 26 are deposited onto the single-crystal quartz wafer 20 in FIG. 1*c*. Next, the two wafers are brought together using a direct bonding process using low temperature bonding/annealing in FIG. 1*d*. A series of processes including wafer grinding/lapping, chemical-mechanical-planarization (CMP), plasma etching and chemical polishing are used to thin the quartz wafer 20 down to a thickness of typically less than 10 microns, for a desired resonant frequency, in FIG. 1*e*. The 10 microns or less thickness is appropriate for quartz resonators with resonant frequencies above 100 MHz. Next, photolithography is used to pattern via holes 28 and 29 in the quartz wafer 20 and holes are etched through the quartz wafer to stop on top-side metal 25 and 26 of aluminum (Al) or gold (Au) and then metallized to form through-wafer conductive vias 28 and 29 in FIG. 1*f*. A bottom-side electrode 24 and bottom-side metal 34 and 35 are then metallized in FIG. 1*g*. Then the quartz wafer 20 is patterned and etched to form a resonator in FIG. 1*h*. Protrusions 41 are etched into the host substrate 40 in FIG. 1*i*, and metallization patterns, including bonding pads 42 and 44, are defined on the host substrate in FIG. 1*j*. The quartz/silicon pair produced in FIG. 1*h* is then bonded to the host substrate 40 using either a gold to gold (Au—Au) or gold to indium (Au—In) compression bonding scheme in FIG. 1*k*. Then the silicon handle wafer 30 is removed with a combination of dry and wet etches, resulting in the quartz resonators being attached only to the host wafer 40, as shown in FIG. 1*l*.

This prior art method uses spin coating of a soft mask (photoresist) for patterning metal, quartz and silicon structures. For example, photolithography is used to pattern via holes 28 and 29 in the quartz wafer 20 and holes 28 and 29 are etched through the quartz wafer to stop on top-side metal 25 and 26 of aluminum (Al) or gold (Au), as shown in FIG. 1*f*. However, for low frequency resonators that require thick quartz substrates, the aluminum or gold metal layer is no longer an adequate etch stop layer due to the long plasma etching required to form via holes in a thick quartz substrate.

Commercially available low frequency quartz resonators are fabricated as separate discrete components due to the conventional processes employed to make them. Fabrication as separate discrete components increase their cost.

Some commercially available low frequency quartz resonators are fabricated using wet etching. Wet etching of quartz is notoriously slow and only allows circular or rectangular quartz blanks to be fabricated due to the asymmetrical etching profiles that result from preferential crystallographic etching rates. For example, a Z-axis etch rate is at least 500 times faster than those of x- and y-axis etch rates. Also, if the crystals are rotated to form various cuts for temperature compensation, then there are further limits on the shapes that can be formed using wet etching. Dry etching allows arbitrary shaped resonators to be formed and provides 3-4× improvement in etch throughput. However, in either case the methods of the prior art to fabricate low frequency quartz resonators are not amenable to wafer or chip scale integration of quartz resonators with other electronic circuits to form, for example, oscillator circuits. This raises the cost of using prior art low frequency quartz resonators.

What is needed is a method of making low frequency quartz resonators that is amenable to wafer production to thereby lower cost and allow chip scale integration of quartz resonators with other electronic circuits. The embodiments of the present disclosure answer these and other needs.

SUMMARY

In a first embodiment disclosed herein, a method for fabricating a low frequency quartz resonator comprises forming a first cavity in a silicon handle, metalizing a top-side of a quartz wafer with a metal etch stop, depositing a first metal layer over the top-side of the quartz wafer and over the metal etch stop, patterning the first metal layer to form a top electrode for the low frequency quartz resonator, aligning and bonding the quartz wafer to the silicon handle so that the top electrode and the metal etch stop are within the first cavity in the silicon handle, thinning the quartz wafer to a desired thickness, depositing and patterning a second metal layer over a bottom-side of the quartz wafer to form a hard etch mask for masking the etching of the quartz wafer, etching the quartz wafer to form a first quartz area for the resonator and to form a via through the quartz wafer for contacting the top electrode, removing the hard etch mask without removing the metal etch stop, depositing a third metal layer on the bottom side of the quartz wafer, applying and patterning photoresist over the third metal layer to form a soft mask, etching areas left unmasked by the soft mask of the third metal layer to form a bottom electrode for the low frequency quartz resonator, removing the photoresist to form a quartz resonator on the silicon handle, depositing a fourth metal layer for a substrate bond pad onto a host substrate wafer, aligning and bonding the quartz resonator on the silicon handle to the substrate bond pad, and removing the silicon handle.

In another embodiment disclosed herein, a low frequency quartz resonator comprises a quartz wafer having a thickness of tens of microns or greater, a metal etch stop comprising nickel on a top-side of the quartz wafer, a top electrode on the top-side of the quartz wafer and electrically coupled to the metal etch stop, a bottom metal area on the bottom-side of the quartz wafer, a conductive via through the quartz wafer for electrically connecting to the metal etch stop and the bottom metal area, a bottom electrode for the low frequency quartz resonator on the bottom-side of the quartz wafer opposite the top electrode, a host substrate, and a substrate bond pad on the host substrate wafer bonded to the bottom metal area.

In yet another embodiment disclosed herein, a method for fabricating a plurality of low frequency quartz resonators on a host substrate starting with a silicon handle and a quartz wafer is provided. The method for forming each of the low frequency quartz resonators of the plurality of low frequency quartz resonators on the host substrate comprises forming a first cavity in the silicon handle, metalizing a top-side of a quartz wafer with a metal etch stop, depositing a first metal layer over a top-side of the quartz wafer and over the metal etch stop, patterning the first metal layer to form a top electrode for the low frequency quartz resonator, aligning and bonding the quartz wafer to the silicon handle so that the top electrode and the metal etch stop are within the first cavity in the silicon handle, thinning the quartz wafer to a desired thickness, depositing and patterning a second metal layer over a bottom-side of the quartz wafer to form a hard etch mask for masking the etching of the quartz wafer, etching the quartz wafer to form a first quartz area for the resonator and to form a via through the quartz wafer for contacting the top electrode, removing the hard etch mask without removing the metal etch stop, depositing a third metal layer on the bottom side of the quartz wafer, applying and patterning photoresist over the third metal layer to form a soft mask, etching areas left unmasked by the soft mask of the third metal layer to form a bottom electrode for the low frequency quartz resonator, removing the photoresist to form a quartz resonator on the silicon handle, depositing a fourth metal layer for a substrate bond pad onto a host substrate wafer, aligning and bonding the quartz resonator on the silicon handle to the substrate bond pad, and removing the silicon handle.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Referring to FIGS. 2*a*-2*g*, 3*a*-3*g*, and 4*a*-4*f* the steps are illustrated for a process flow in accordance with the present disclosure for fabricating thick quartz resonators for low frequency resonant frequencies. Although the method is applicable to fabricating multiple resonators at once, FIGS. 2*a*-2*g*, 3*a*-3*g*, and 4*a*-4*f* illustrate only one resonator being fabricated, but it should be understood that the process is able to fabricate multiple low frequency quartz resonators simultaneously to achieve the benefits of wafer scale production. FIGS. 5A to 5C are flow charts of the method of FIGS. 2*a*-2*g*, 3*a*-3*g*, and 4*a*-4*f* for making a quartz resonator in accordance with the present disclosure. References in the following description are to the illustrations of FIGS. 2*a*-2*g*, 3*a*-3*g*, and 4*a*-4*f* and to the steps in FIGS. 5A to 5C.

Figure 1:
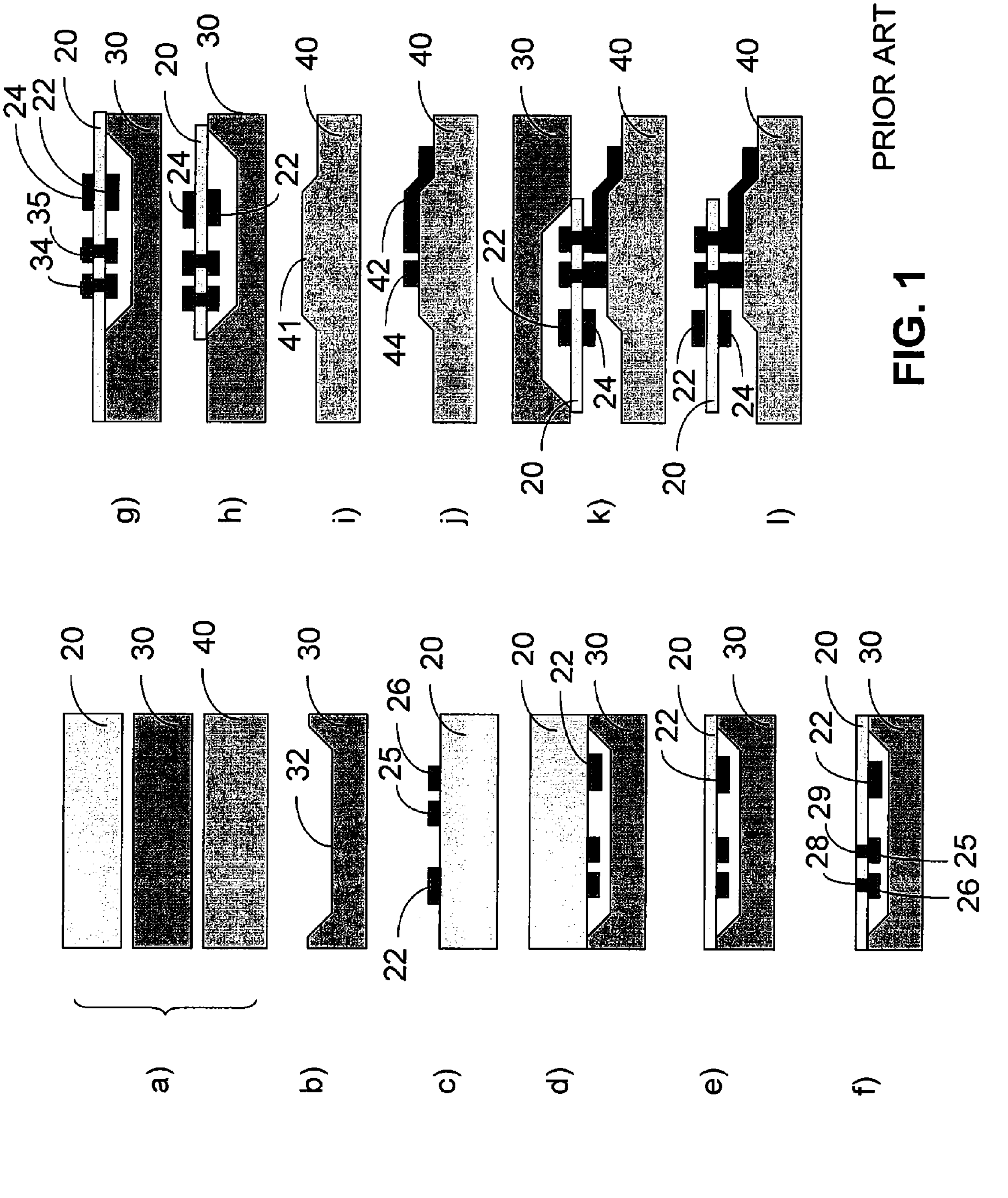
FIG. 1 PRIOR ART
FIGS. 1*a* to 1*l* illustrates a method for making a quartz resonator in accordance with the prior art.
Figure 2:
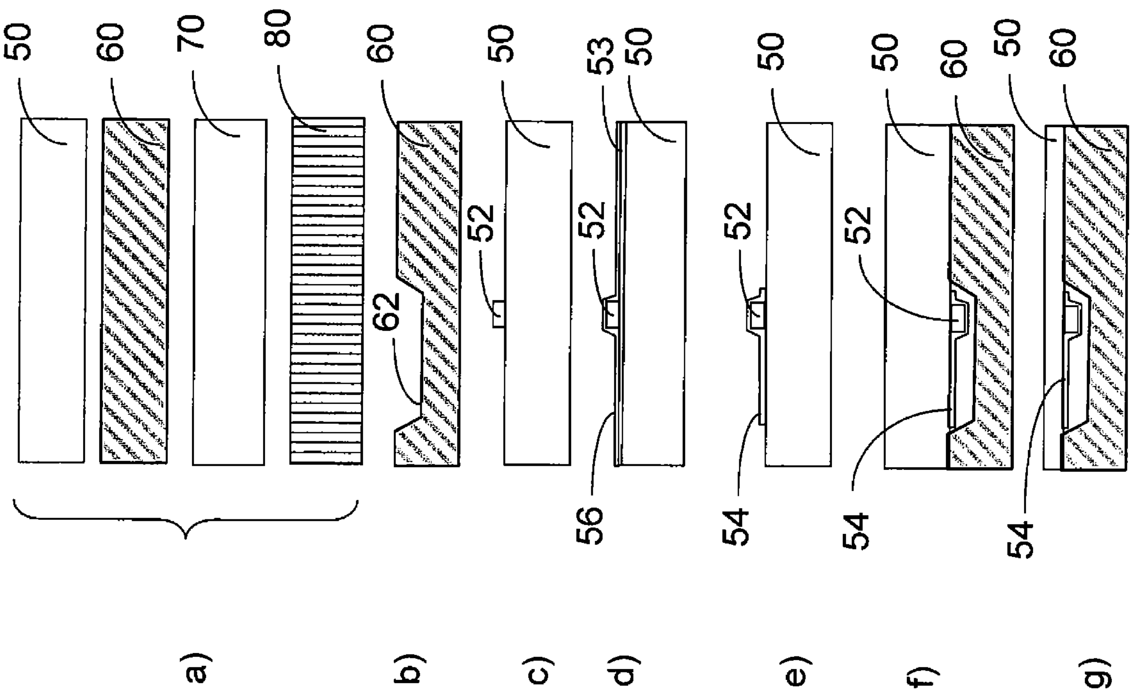
FIGS. 2*a*-2*g*, 3*a*-3*g*, and 4*a*-4*f* illustrate a method for making a quartz resonator in accordance with the present disclosure.

The starting materials consist of a quartz wafer 50 for the resonator, a silicon handle wafer 60, a host substrate wafer 70, such as a silicon wafer, and a silicon cap wafer 80 for encapsulation, as shown in FIG. 2*a* and step 100 on the flow chart of FIG. 5A. The host substrate wafer 70 may be a CMOS ASIC wafer with other circuitry such as oscillator drive circuitry. The fabrication begins with an etch of a cavity 62 into the silicon handle 60 to create room to accommodate any top-side metallization on the quartz wafer 50, as shown in FIG. 2*b* and step 102 on the flow chart of FIG. 5A.

Next, the top-side of the quartz wafer 50 is metallized with a metal etch stop 52 (e.g., Cr/Ni/Au) for the deep quartz etch, as shown in FIG. 2*c* and step 104 on the flow chart of FIG. 5A. The metal etch stop is deposited to provide a barrier or stop for an etch process. The chromium (Cr) provides better adhesion to quartz and the nickel (Ni) provides the etch stop. The gold (Au) provides metallization for electrical connects. A conformal metal coating such as Cr 53 and Au 56 is then deposited over the metal etch stop layer, as shown in FIG. 2*d* and step 106 on the flow chart of FIG. 5A. Then, as shown in FIG. 2*e* and step 108 on the flow chart of FIG. 5A, the conformal metal coating is patterned to form a top electrode 54 for the quartz resonator. The metal etch stop 52 also provides an electrical contact to the top electrode 54.

As shown in FIG. 2*f* and step 110 on the flow chart of FIG. 5A, the quartz wafer 50 is then aligned and bonded to the silicon handle wafer 60 using a low temperature bonding/annealing process, so that the top electrode 54 and the metal etch stop 52 are within the cavity 62 in the silicon handle 60. Then, as shown in FIG. 2*g* and step 112 on the flow chart of FIG. 5A, the quartz wafer 50 is subsequently thinned to a desired thickness of tens of microns or greater to obtain a low resonant frequency for the quartz resonator. The thinning may be performed using wafer grinding and/or chemical mechanical planarization (CMP).

Figure 3:
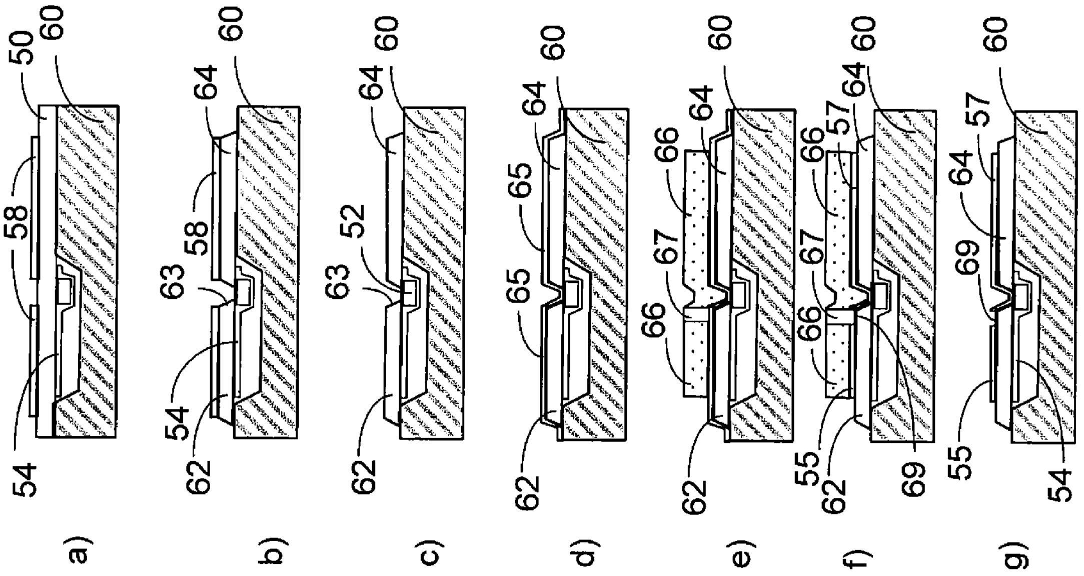

An aluminum metal layer 58 is then deposited with a thickness of approximately 1 micron for every 15 microns of quartz wafer 50 thickness, and patterned to form a hard etch mask for the dry etching of quartz wafer 50, as shown in FIG. 3*a* and step 114 on the flow chart of FIG. 5B. The thickness of the aluminum metal layer 58 relative to the quartz wafer 50 thickness ensures that the aluminum metal layer 58 will not be etched through while etching the quartz wafer 50. Then, as shown in FIG. 3*b* and step 116 on the flow chart of FIG. 5B, the quartz wafer 50 is etched through using a fluorine-chemistry, high-density plasma deep reactive ion etcher to form a first quartz area 62 for the resonator, to form a via 63 through the quartz wafer 50 for contacting the top electrode 54, and to form a second quartz area 64. Next as shown in FIG. 3*c* and step 118 on the flow chart of FIG. 5B, the aluminum metal layer 58 mask is removed with a nickel-compatible wet etchant so that the Ni in metal etch stop 52 is not etched.

The quartz etch process in steps 114, 116 and 118 are advancements over the prior art, which generally uses photolithography methods using photoresist masks to etch the quartz. As discussed above, wet etching of quartz is notoriously slow and only allows circular or rectangular quartz blanks to be fabricated due to the asymmetrical etching profiles that result from preferential crystallographic etching rates. The methods of the present invention, as discussed for steps 114, 116 and 118 define simultaneously both the first quartz area 62 for the resonator and the via 63 through the quartz wafer 50 for contacting the top electrode 54 and also allow the quartz to be etched in complex shapes beyond just circular or rectangular, which is desirable when combining other circuitry with the low frequency resonator. These methods also save processing time and the associated costs.

The topography between the quartz area 62 and the via 63 is relatively severe after step 118, which presents an issue for any subsequent processing steps on the bottom side of the quartz wafer 50. This issue is solved with conformal coatings of photoresist and metals as discussed below.

As shown in FIG. 3*d* and step 120 on the flow chart of FIG. 5B, sputtered metal (e.g., Cr/Au) is conformally coated to form the bottom side metallization 65, which also coats the via 63 and provides an electrical contact to the top electrode 54 through the via 63. Again, the Cr is used to provide better adhesion to the quartz wafer 50 and any subareas formed of the quartz wafer 50, such as first quartz area 62.

Then, as shown in FIG. 3*e* and step 122 on the flow chart of FIG. 5B, photoresist 66 is sprayed on and patterned to leave a hole 67 in the photoresist so that after etching a bottom electrode 55 formed, as shown in FIG. 3*f* and step 124 on the flow chart of FIG. 5B, is not electrically connected to the top electrode 54 through via 63. Next, processes of photoresist lithography and metal etch are used, as shown in FIG. 3*f* and step 124 on the flow chart of FIG. 5B, to pattern the bottom electrode 55, while overcoming the severe topography created by the thick quartz etch. The etching through hole 67 in the photoresist etches a portion 69 of the metal 55 to separate bottom electrode 55 from the via 63. Also after step 124 a metal area 57 is left on the second quartz area 64. Then, as shown in FIG. 3*g* and step 126 on the flow chart of FIG. 5B, the photoresist 66 is removed.

Figure 4:
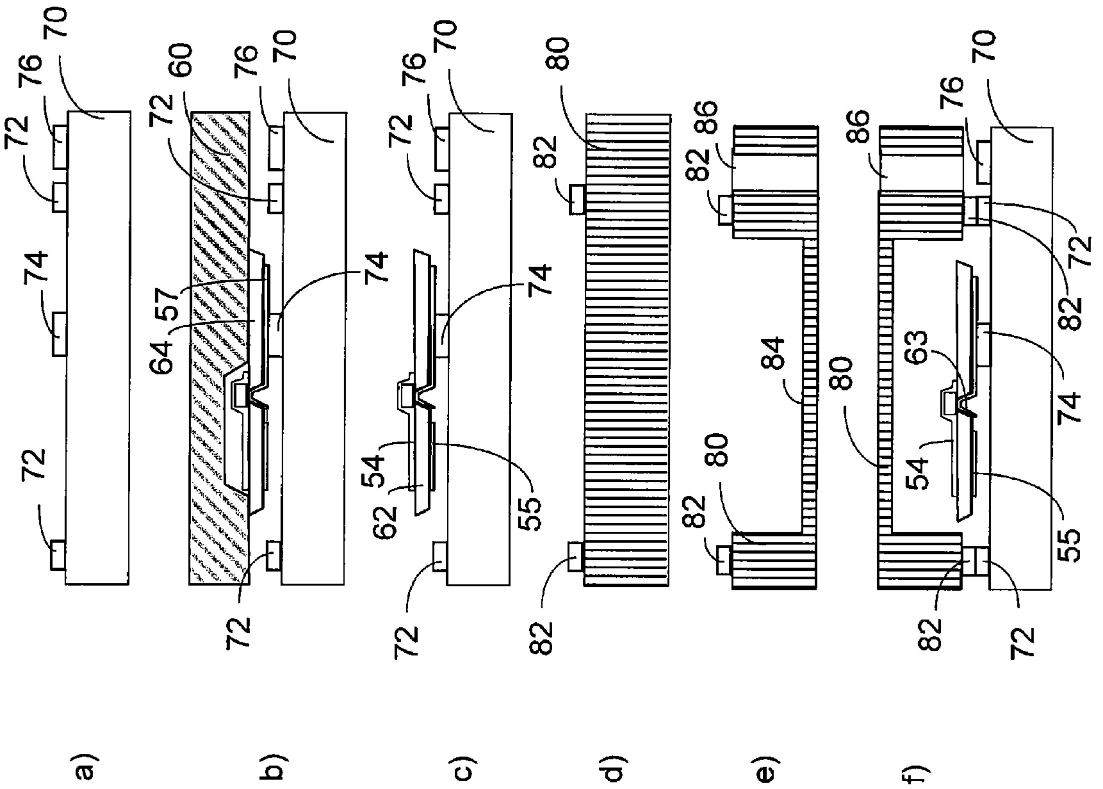
Figure 5A:
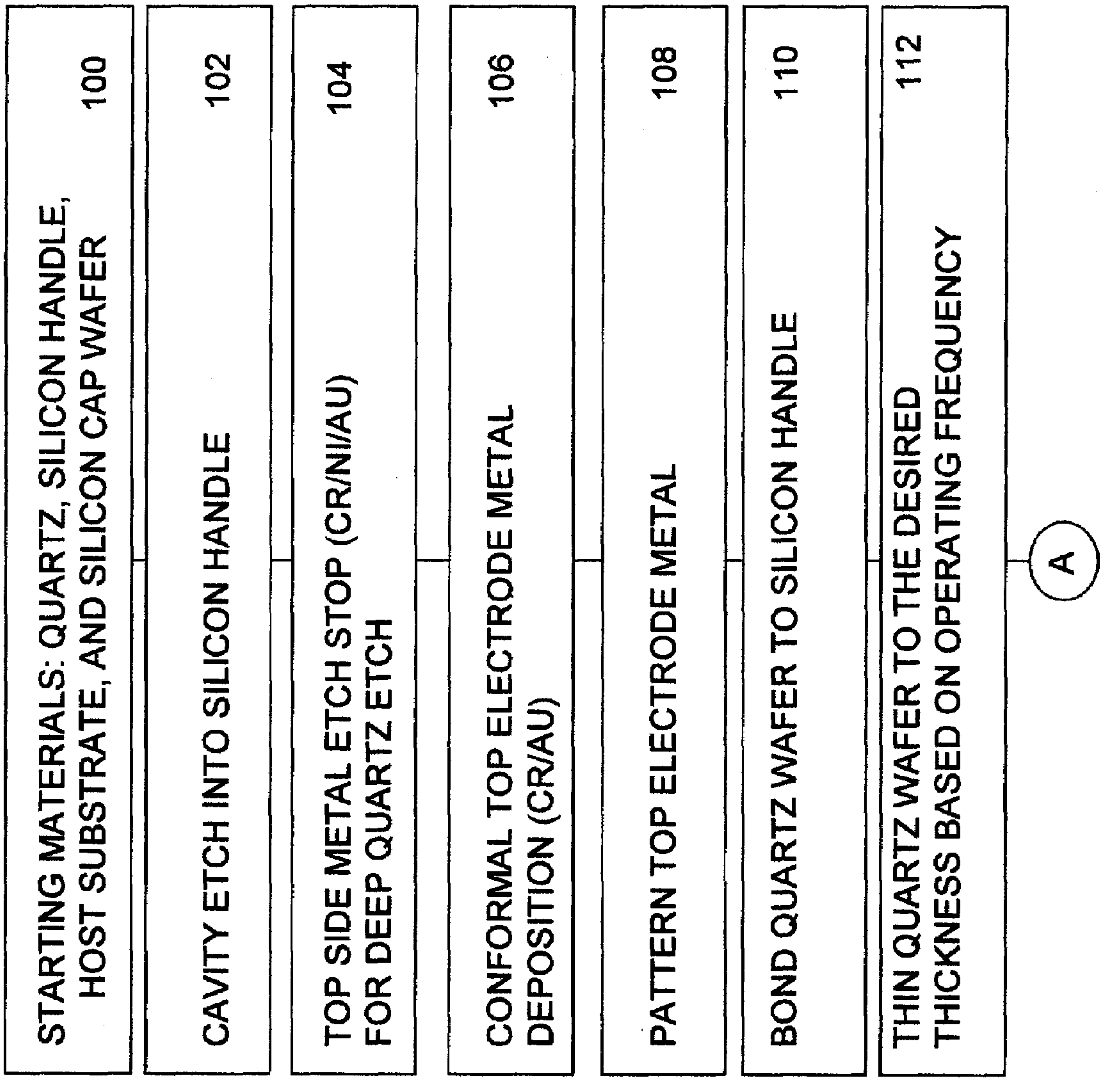
FIGS. 5A to 5C are flow charts of the method of FIGS. 2*a*-2*g*, 3*a*-3*g*, and 4*a*-4*f* for making a quartz resonator in accordance with the present disclosure.
Figure 5B:
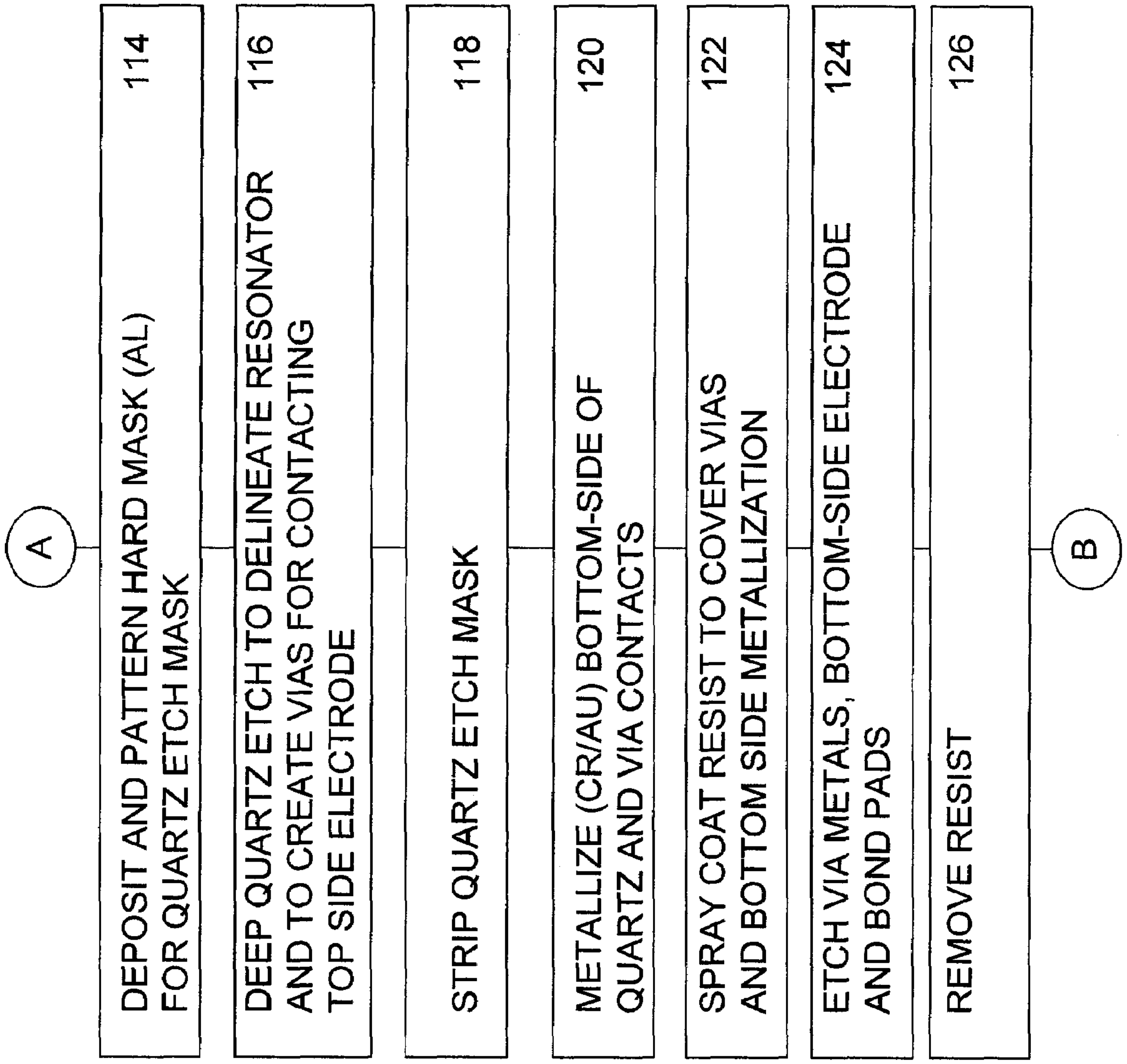
Figure 5C:
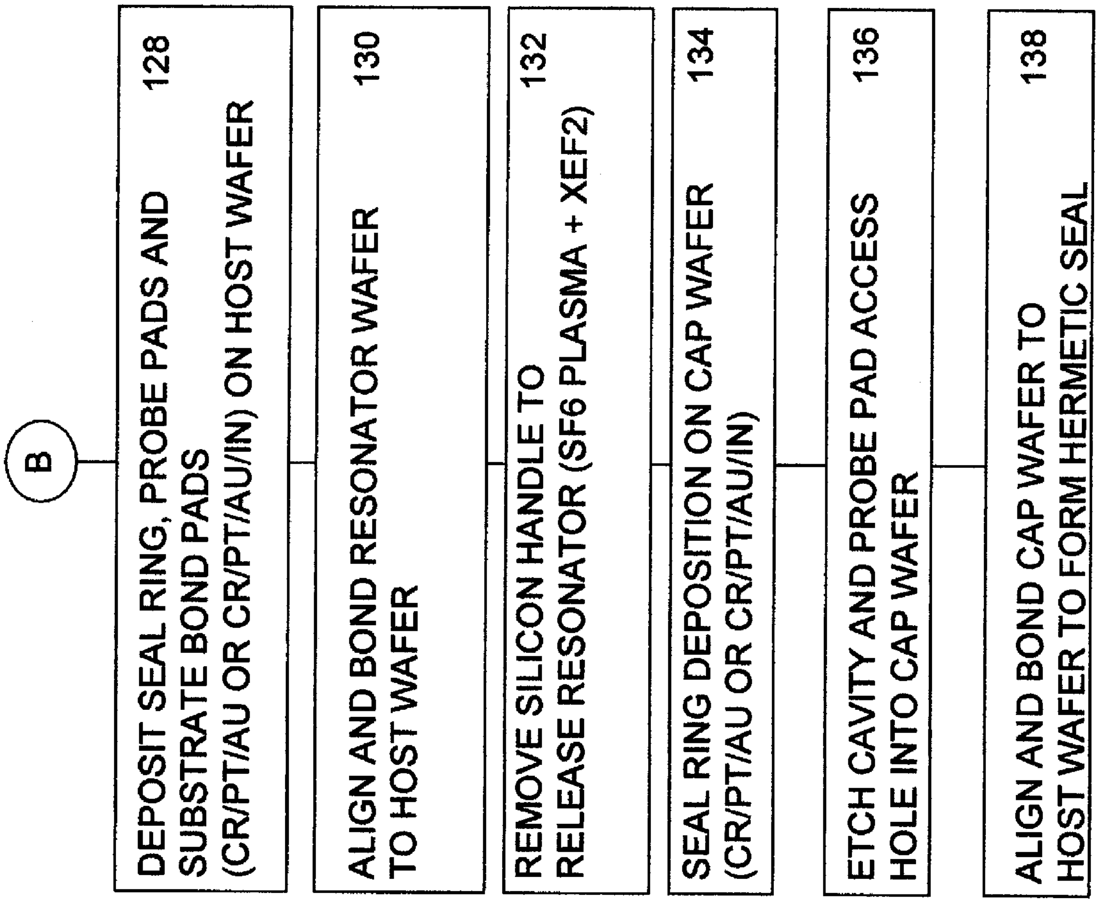

Then, as shown in FIG. 4*a* and FIG. 5C step 128, a seal ring 72, probe pads 76 and substrate bond pads 74 are deposited with metal, such as Cr/Pt/Au where Pt is platinum, or Cr/Pt/Au/In where In is Indium, onto the host wafer 70. Next, as shown in FIG. 4*b* and FIG. 5C step 130 the quartz/silicon handle pair produced in step 126, as shown in FIG. 3*g*, is aligned and the metal area 57 on the second quartz area 64 is bonded to the substrate bond pad 74 on the host wafer 70 with a metal-metal thermo-compression bond. Next, as shown in FIG. 4*c* and FIG. 5C step 132, a dry silicon etch, for example such as SF6 plasma and/or XeF2, is used to remove the silicon handle in order to release the quartz resonator, which includes first quartz area 62, top electrode 54 and bottom electrode 55.

Then, as shown in FIG. 4*d* and FIG. 5C step 134, a seal ring 82, comprised of for example Cr/Pt/Au or Cr/Pt/Au/In, is deposited on the cap wafer 80, matching the seal ring 72 on the host wafer 70. Next, as shown in FIG. 4*e* and FIG. 5C step 136, a cavity 84 and probe pad access holes 86 are etched into the cap wafer 80 using deep reactive ion etching (DRIE) of the silicon cap wafer 80. Finally, as shown in FIG. 4*f* and FIG. 5C step 138, the cap wafer 80 is aligned and bonded to the host wafer 70 so that the seal rings 72 and 82 are bonded to form a hermetic seal for the quartz resonator.

Figure 6:
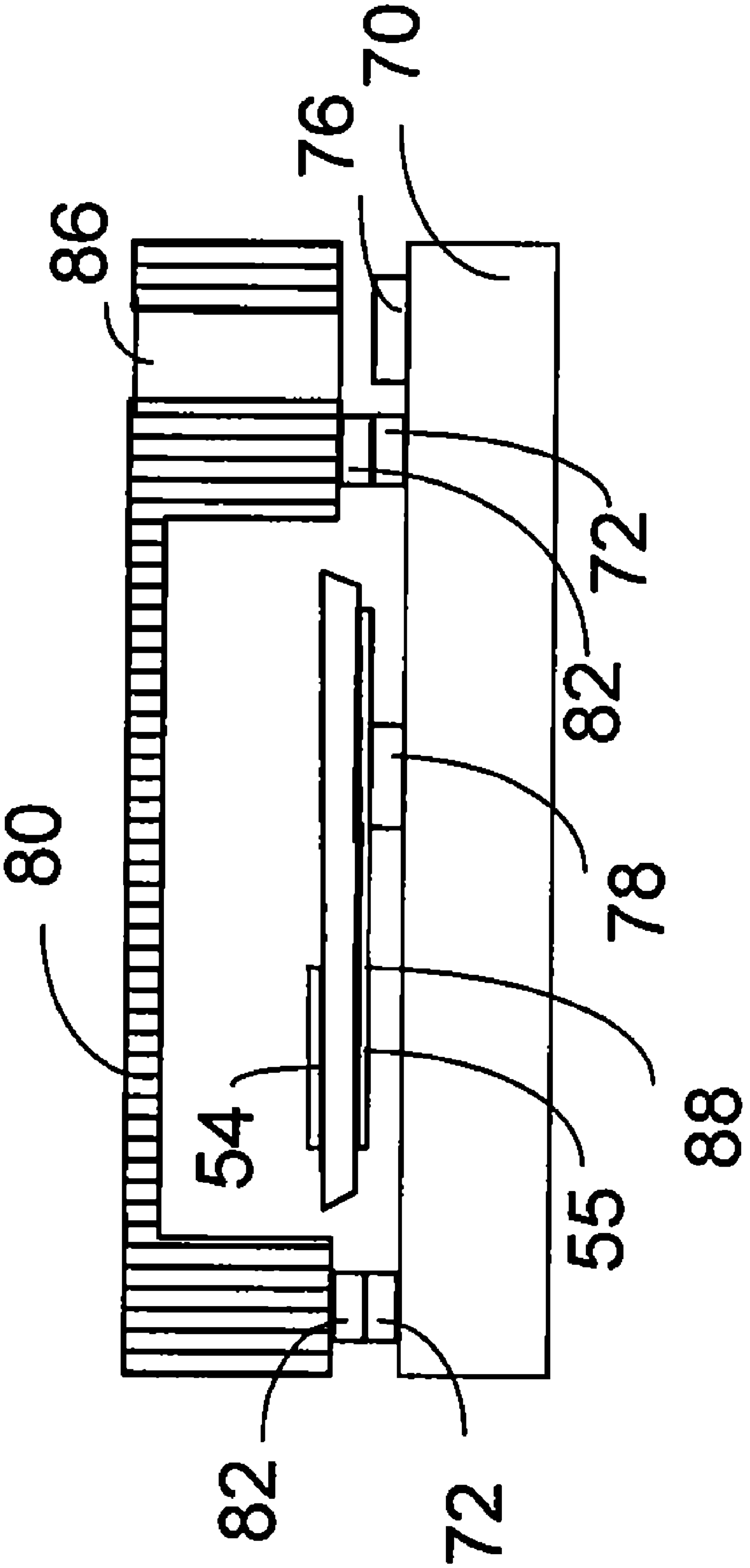
FIG. 6 shows another view of a quartz resonator in accordance with the present disclosure.

As shown in FIG. 4*f* the substrate bond pad 74 connects to the top electrode 54 for the quartz resonator through via 63. A connection for the bottom electrode 55 is shown in FIG. 6, which is an elevation sectional view in another location than that shown in FIG. 4*f*. In this location there is no via 63 connecting to the top electrode 54. Thus a second substrate bond pad 78 can be connected by metal 88 to the bottom electrode 55. The metal 88 to connect to the bottom electrode 55 is easily formed during steps 122 and 124 shown in FIG. 5B.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A low frequency quartz resonator comprising:

a quartz wafer having a thickness of tens of microns or greater;

a metal etch stop comprising nickel on a top-side of the quartz wafer;

a top electrode on the top-side of the quartz wafer and electrically coupled to the metal etch stop;

a bottom metal area on the bottom-side of the quartz wafer;

a conductive via through the quartz wafer for electrically connecting to the metal etch stop and the bottom metal area;

a bottom electrode for the low frequency quartz resonator on the bottom-side of the quartz wafer opposite the top electrode;

a host substrate; and a substrate bond pad on the host substrate wafer bonded to the bottom metal area.

2. The low frequency quartz resonator of claim 1 further comprising:

a first seal ring and at least one probe pad on the host substrate wafer;

a cap wafer having a cavity and at least one probe pad access hole; and a second seal ring on the cap wafer and bonded to the first seal ring to form a hermetic seal for the low frequency quartz resonator.

3. The low frequency quartz resonator of claim 1 wherein the top electrode is disconnected electrically from the bottom electrode.

4. The low frequency quartz resonator of claim 1 wherein the substrate bond pad comprises chromium, platinum and gold or chromium, platinum, gold and indium.

* * * * *